United States Patent
Hayakawa et al.

(10) Patent No.: US 9,657,386 B2
(45) Date of Patent: May 23, 2017

(54) TRANSPARENT CONDUCTIVE FILM AND METHOD FOR PRODUCING SAME

(71) Applicant: KANEKA CORPORATION, Osaka-shi, Osaka (JP)

(72) Inventors: Hironori Hayakawa, Otsu (JP); Takashi Kuchiyama, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/126,265

(22) PCT Filed: Feb. 3, 2015

(86) PCT No.: PCT/JP2015/053008
§ 371 (c)(1),
(2) Date: Sep. 14, 2016

(87) PCT Pub. No.: WO2015/146292
PCT Pub. Date: Oct. 1, 2015

(65) Prior Publication Data
US 2017/0081754 A1    Mar. 23, 2017

(30) Foreign Application Priority Data
Mar. 28, 2014 (JP) ................................. 2014-069113

(51) Int. Cl.
*B32B 15/00* (2006.01)
*B05D 1/00* (2006.01)
(Continued)

(52) U.S. Cl.
CPC ............ *C23C 14/086* (2013.01); *C23C 14/34* (2013.01); *C23C 14/562* (2013.01)

(58) Field of Classification Search
USPC ....... 428/426, 432, 688, 689, 697, 699, 701, 428/702; 427/402, 419.2, 419.3;
(Continued)

(56) References Cited

U.S. PATENT DOCUMENTS 6,617,056 B1* 9/2003 Hara .................. C23C 14/0036
204/192.14
2003/0207093 A1* 11/2003 Tsuji ..................... C23C 16/407
428/209

(Continued)

FOREIGN PATENT DOCUMENTS

| JP | 2002170431 A | 6/2002 |
|----|--------------|--------|
| JP | 2003100152 A | 4/2003 |

(Continued)

OTHER PUBLICATIONS

ISA Japan Patent Office, International Search Report Issued in Application No. PCT/JP2015/053008, May 12, 2015, WIPO, 4 pages.

(Continued)

*Primary Examiner* — Lauren R Colgan
(74) *Attorney, Agent, or Firm* — Alleman Hall Creasman & Tuttle LLP (57) ABSTRACT

A transparent electroconductive film includes a transparent electrode layer on a transparent film substrate. The transparent electrode layer is formed of an amorphous indium tin composite oxide and has a tin oxide content of 3 to 12% by mass and a thickness of 15 to 30 nm. In an analysis range of the transparent electrode layer, a bond energy $E_{Sn}$ of tin $3d_{5/2}$ and a bond energy $E_{In}$ of indium $3d_{5/2}$ as determined by X-ray photoelectron spectroscopy measurement satisfy the following requirements: a minimum point of a bond energy difference between the bond energies $E_{Sn}$ and $E_{In}$ is present closer to the surface of the transparent electrode layer than a maximum point of the bond energy difference $E_{Sn}-E_{In}$;

(Continued)

and a difference $E_{max}-E_{min}$ between the maximum value $E_{max}$ and the minimum value $E_{min}$ of the bond energy difference is 0.1 eV or more.

9 Claims, 4 Drawing Sheets

(51) Int. Cl.
    *C23C 14/08*     (2006.01)
    *C23C 14/34*     (2006.01)
    *C23C 14/56*     (2006.01)

(58) Field of Classification Search
    USPC ..................................................... 204/192.1
    See application file for complete search history.

(56) References Cited

U.S. PATENT DOCUMENTS

| | | | | |
|---|---|---|---|---|
| 2003/0218153 A1* | 11/2003 | Abe | ................ | C23C 14/08 |
| | | | | 252/500 |
| 2004/0066484 A1* | 4/2004 | Tokailin | ............ | G02F 1/13439 |
| | | | | 349/158 |
| 2007/0051926 A1* | 3/2007 | Nakayama | ......... | C03C 17/3417 |
| | | | | 252/500 |
| 2013/0048348 A1* | 2/2013 | Yamazaki | ............... | G06F 3/041 |
| | | | | 174/254 |
| 2013/0288047 A1* | 10/2013 | Kajihara | ............ | C23C 14/3414 |
| | | | | 428/336 |
| 2014/0050908 A1* | 2/2014 | Nashiki | ................ | C23C 14/086 |
| | | | | 428/216 |
| 2014/0141237 A1* | 5/2014 | Takeyasu | ................ | G06F 3/044 |
| | | | | 428/336 |
| 2014/0370275 A1* | 12/2014 | Kuchiyama | ........... | C23C 14/086 |
| | | | | 428/336 |
| 2015/0357076 A1* | 12/2015 | Sasa | ........................ | C23C 14/34 |
| | | | | 428/216 |
| 2015/0357077 A1* | 12/2015 | Sasa | ........................ | C23C 14/34 |
| | | | | 428/336 |
| 2016/0024640 A1* | 1/2016 | Sasa | ....................... | C23C 14/086 |
| | | | | 428/336 |
| 2016/0024644 A1* | 1/2016 | Sasa | ........................ | C23C 14/34 |
| | | | | 204/192.14 |
| 2016/0160345 A1* | 6/2016 | Miyamoto | ............... | B32B 7/00 |
| | | | | 428/412 |

FOREIGN PATENT DOCUMENTS

| | | |
|---|---|---|
| JP | 2004149884 A | 5/2004 |
| JP | 2012134085 A | 7/2012 |
| JP | 2014103067 A | 6/2014 |
| WO | 2013040452 A2 | 3/2013 |
| WO | 2013047345 A1 | 4/2013 |
| WO | 2013081106 A1 | 6/2013 |
| WO | 2013111681 A1 | 8/2013 |

OTHER PUBLICATIONS

International Bureau of WIPO, International Preliminary Report on Patentability Issued in Application No. PCT/JP2015/053008, Oct. 13, 2016, WIPO, 5 pages.

* cited by examiner

TRANSPARENT CONDUCTIVE FILM AND METHOD FOR PRODUCING SAME

TECHNICAL FIELD

The invention relates to a transparent conductive film in which a transparent electrode layer is formed on a transparent film substrate, and the invention also relates to a production method thereof.

BACKGROUND ART

Substrates with a transparent electrode in which a conductive oxide thin-film of indium tin composite oxide (ITO) or the like is formed on a transparent substrate such as a transparent film or glass are widely used as transparent electrodes for displays and touch panels. The electric resistance and the light transmittance are main factors that determine the performance of a substrate with a transparent electrode, and one having low resistance and high light transmittance is desired in the market.

As a method for forming an ITO film having low resistance and high transparency, a method is widely used in which an amorphous ITO film is formed on a transparent film by a sputtering method, and then heated under an oxygen atmosphere, for example in the air, to crystallize the amorphous ITO.

It is preferable that the time required for crystallization by heating (annealing) is short from the viewpoint of productivity, and ITO that is easily crystallized has been desired heretofore. Patent Documents 1 and 2 disclose a method for producing a transparent conductive film which is easily crystallized by short-time heating. On the other hand, an amorphous conductive oxide thin-film may be desired depending on the use purpose of the transparent conductive film, and Patent Document 3 discloses a method for producing a transparent conductive film which is not easily crystallized.

Patent Document 4 describes a method for producing a transparent conductive film which can be crystallized at room temperature or a low temperature and thus high temperature heat treatment is required for crystallization.

PRIOR ART DOCUMENTS

Patent Documents

Patent Document 1: Japanese Patent Laid-open Publication No. 2012-134085
Patent Document 2: Japanese Patent Laid-open Publication No. 2004-149884
Patent Document 3: Japanese Patent Laid-open Publication No. 2003-100152
Patent Document 4: International Publication No. WO 2013/111681

SUMMARY OF THE INVENTION

Problems to be Solved by the Invention

Patent Document 4 describes that ITO may be crystallized when a substrate with a transparent electrode is stored in a room-temperature environment for a long period of time. ITO crystallized in a room-temperature environment may have a negative influence on a process for production of a device such that etching for forming an electrode pattern is difficult.

In view of the problems described above, an object of the present invention is to provide a transparent conductive film which is hardly crystallized in a room-temperature environment and is thus stable and which can be crystallized by short-time heating and has low resistance after crystallization.

Means for Solving the Problems

The inventors have extensively conducted studies, and resultantly found that a transparent conductive film which satisfies the properties described above can be obtained when a bond energy difference $E_{Sn}-E_{In}$ between bond energy $E_{Sn}$ of tin $3d_{5/2}$ and bond energy $E_{In}$ of indium $3d_{5/2}$ as calculated from an X-ray photoelectron spectroscopy spectrum meets a specific requirement in the thickness direction of the transparent electrode layer formed of amorphous indium tin composite oxide.

The present invention relates to a transparent conductive film including a transparent film substrate, and an amorphous transparent electrode layer on the transparent film substrate. The transparent electrode layer is formed of indium tin composite oxide, and has a tin oxide content of 3 to 12% by mass and a thickness of 15 to 30 nm.

In the transparent electrode layer, bond energy $E_{Sn}$ of tin $3d_{5/2}$ and bond energy $E_{In}$ of indium $3d_{5/2}$ as determined by X-ray photoelectron spectroscopy measurement preferably satisfy the following requirements (1) and (2) in the following analysis range: analysis range: a region which contains 40 atom % or more of indium and which does not include a region where a distance d from the surface of the transparent electrode layer in the thickness direction is from 0 to 3 nm;
(1) the minimum value $E_{min}$ of a bond energy difference $E_{Sn}-E_{In}$ between the bond energy $E_{Sn}$ and the bond energy $E_{In}$ is present closer to the surface of the transparent electrode layer than the maximum value $E_{max}$ of the bond energy difference $E_{Sn}-E_{In}$; and
(2) a difference $E_{max}-E_{min}$ between the maximum value $E_{max}$ and the minimum value $E_{min}$ is 0.1 eV or more.

In the analysis range, the slope of a line obtained by plotting the bond energy difference $E_{Sn}-E_{In}$ on the ordinate and the distance d on the abscissa, and approximating the plot by a least square method is preferably 0.005 eV/nm or more.

In the analysis range, the maximum value $E_{max}$ of the bond energy difference $E_{Sn}-E_{In}$ is preferably 41.92 eV or more, and the minimum value $E_{min}$ of the bond energy difference $E_{Sn}-E_{In}$ is preferably 41.95 eV or less.

In the transparent conductive film of the present invention, the resistivity of the transparent electrode layer after heating at 140° C. for 30 minutes may be $3.2 \times 10^{-4}$ Ωcm or less.

The present invention relates to a method for producing the transparent conductive film. The amorphous transparent electrode layer is deposited under deposition conditions in two or more stages which include a first condition for depositing a first electrode layer on a transparent film substrate, and a second condition for depositing a second electrode layer on the first electrode layer. The thickness of the first electrode layer is preferably 1 to 4 nm.

The oxygen partial pressure in deposition of the first electrode layer is preferably higher than the oxygen partial pressure in deposition of the second electrode layer. The power in deposition of the first electrode layer is preferably smaller than the power in deposition of the second electrode layer.

The tin oxide content in a target that is used in deposition of the first electrode layer is preferably equal to the tin oxide content in a target that is used in deposition of the second electrode layer.

Effects of the Invention

According to the present invention, there is provided a transparent conductive film which is hardly crystallized in a room-temperature environment and can be crystallized by short-time heating. Further, by heating the resulting transparent conductive film, a transparent conductive film having low resistance can be obtained.

DESCRIPTION OF EMBODIMENT

Hereinafter, preferred embodiments of the present invention will be described. Dimensional relationships as to thickness and so on are appropriately changed for clarification and simplification of the drawings, and actual dimensional relationships are not shown.

[Transparent Conductive Film]

Figure 1:
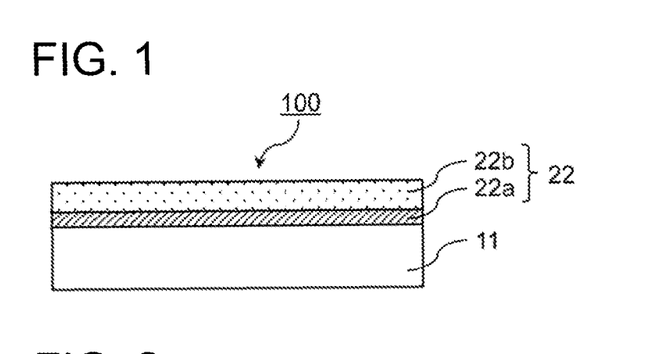
FIG. 1 is a sectional schematic view showing one example of a transparent conductive film.

FIG. 1 shows a transparent conductive film 100 including a transparent film substrate 11, and an amorphous transparent electrode layer 22 on the transparent film substrate 11.

As the transparent film substrate 11, one that is colorless and transparent in a visible light region is preferably used. Examples thereof include polyester resins such as polyethylene terephthalate (PET), polybutylene terephthalate (PBT) and polyethylene naphthalate (PEN), cycloolefin-based resins, polycarbonate resins and cellulose-based resins. Among them, polyester resins and cycloolefin-based resins are preferable, and polyethylene terephthalate is especially preferable. The glass transition temperature of a general transparent film substrate is 50° C. to 150° C. On the other hand, a film substrate having a high glass transition temperature of 200° C. or higher, such as a transparent polyimide film substrate, is very expensive, and therefore is not preferable from the viewpoint of the cost.

The thickness of the transparent film substrate 11 is not particularly limited, and is preferably 0.01 to 4 mm, more preferably 0.02 to 0.3 mm. A thicker transparent film substrate is harder to be deformed during deposition, but when the thickness is excessively large, flexibility is deteriorated, so that deposition in a roll-to-roll method is difficult. When the thickness of the transparent film substrate is in the above-mentioned range, deformation of the film substrate by heat can be suppressed to perform deposition with high productivity in a roll-to-roll method.

The transparent film substrate 11 may be surface-treated for the purpose of improving adhesion between the substrate and the transparent electrode layer. Examples of surface treatment include methods for increasing adhesive strength by imparting electric polarity to a surface of the substrate. Specific examples thereof include corona discharge and plasma treatment methods.

The transparent electrode layer 22 is formed of indium tin composite oxide (ITO). The content of indium oxide is preferably 87.5 to 99.0% by mass, more preferably 90 to 95% by mass. The content of tin oxide is preferably 3 to 12% by mass, more preferably 6 to 10% by mass. When the content of each of indium oxide and tin oxide is in a range as described above, the effect of the present invention may be properly exerted. The transparent electrode layer may contain components other than indium oxide and tin oxide as long as the feature of the present invention is not impaired.

It is known that indium oxide is relatively easily crystallized even when oxygen deficiency exists. Oxygen deficiency in indium oxide generates carrier electrons, so that the stability of ITO in a low-temperature region is improved, and therefore deficiency of oxygen that is bonded to indium may have a positive influence on ITO film quality. Accordingly, the ratio of oxygen atoms contained in indium oxide in ITO is preferably lower than the ratio of oxygen atoms contained in stoichiometric indium oxide.

The thickness of the transparent electrode layer 22 is preferably 15 to 30 nm, more preferably 18 to 25 nm for the transparent electrode layer to have low resistance and high transparency. Further, in the present invention, the thickness of the transparent electrode layer is preferably in a range as described above for easily crystallizing an amorphous transparent electrode layer by short-time heating, and suppressing crystallization in a room-temperature environment.

FIG. 1 shows an example in which the transparent electrode layer 22 has a two-layer structure including a first electrode layer 22a formed on the transparent film substrate 11, and a second electrode layer 22b formed on the first electrode layer 22a. The transparent electrode layer 22 may have a single-layer structure or a three or more-layer structure.

In the transparent electrode layer 22, bond energy such as bond energy $E_{Sn}$ of tin $3d_{5/2}$ and bond energy $E_{In}$ of indium $3d_{5/2}$ can be calculated by performing X-ray photoelectron spectroscopy (XPS) measurement in the thickness direction. Further, by comparing the peak maximum values of elements in an object to be measured, element ratios (atom ratios) of tin, indium, oxygen and so on can be calculated. The method for XPS measurement, and the detailed methods for calculating the bond energy and atom ratio of each element will be described later in example section. When XPS measurement is performed in the thickness direction of the transparent electrode layer, the measurement interval is not particularly limited, and the measurement may be performed at intervals of, for example, 1 to 2 nm in the thickness direction.

The term "$3d_{5/2}$" refers to one of electron orbits that form an atom, and the bond energy of $3d_{5/2}$ refers to the magnitude of energy required for removing electrons, which occupy the electron orbit, from the atom. The magnitude of bond energy is known to vary depending not only on the type of an element and the type of an electron orbit, but also on the chemical state of the element. Conversely, definition of the amount of change in bond energy in the same electron orbit of the same element is nothing other than definition of the chemical state of the element. For example, the bond energy of indium or tin in ITO is known to vary depending on the valence of the metal atom, i.e., the number of bonded oxygen atoms.

Measurement of bond energy change in the thickness direction of the transparent electrode layer includes an analysis method of removing electrons from the surface of a sample, and therefore the surface of the sample is charged as the measurement proceeds. When the surface of the sample is charged, an electric field generated by charging has an influence on the bond energy of the detected electron. Accordingly, a change in bond state between each element and oxygen is not necessarily correctly reflected when the bond energy of indium or tin itself is evaluated. The amount of deviation of a bond energy value due to charging as described above is the same irrespective of the type of an element. Thus, when a bond energy difference $E_{Sn}-E_{In}$ obtained by subtracting bond energy $E_{In}$ of $In3d_{5/2}$ from bond energy $E_{Sn}$ of $Sn3d_{5/2}$ is evaluated, an influence of charging can be eliminated from the measurement result.

The transparent electrode layer 22 preferably satisfies the following requirements (1) and (2) in the following analysis range, with respect to bond energy $E_{Sn}$ of tin $3d_{5/2}$ and bond energy $E_{In}$ of indium $3d_{5/2}$ as determined by XPS measurement:

analysis range: a region which contains 40 atom % or more of indium and which does not include a region where a distance d from the surface of the transparent electrode layer in the thickness direction is from 0 to 3 nm;

(1) the minimum value $E_{min}$ of a bond energy difference $E_{Sn}-E_{In}$ between the bond energy $E_{Sn}$ and the bond energy $E_{In}$ is present closer to the surface of the transparent electrode layer than the maximum value $E_{max}$ of the bond energy difference $E_{Sn}-E_{In}$; and (2)$_a$ difference $E_{max}-E_{min}$ between the maximum value $E_{max}$ and the minimum value $E_{min}$ is 0.1 eV or more.

Here, a large bond energy difference $E_{Sn}-E_{In}$ indicates that tin is oxidated more strongly than indium. It is generally considered that tin oxide is harder to be crystallized than indium oxide. This suggests that rearrangement of atoms is hard to occur on the periphery of tin atoms. Therefore, it is considered that when the requirement (1) is satisfied, the bond energy difference $E_{Sn}-E_{In}$ in the vicinity of the interface with the transparent film substrate is large, so that elements on the periphery of tin are nearly crystalline. As a result, rearrangement of atoms on the periphery of the tin element, which is associated with crystallization of ITO, can be minimized, so that crystallization can be performed by short-time heating.

When the requirement (2) is satisfied, it indicates that the bond energy difference $E_{Sn}-E_{In}$ is changed in the thickness direction of the transparent electrode layer. Specifically, the transparent electrode layer is formed on the transparent film substrate while the bond state between tin and oxygen and the bond state between indium and oxygen are changed in the thickness direction. Accordingly, it is considered that this influences the crystallization rate and resistance stability.

From the above, it is considered that by satisfying the requirements (1) and (2), a transparent conductive film which is hardly crystallized in a room-temperature environment and is crystallized by short-time heating can be formed.

In the analysis range, the difference $E_{max}-E_{min}$ between the maximum value $E_{max}$ and the minimum value $E_{min}$ is preferably 0.1 eV or more, more preferably 0.2 eV or more, and preferably 0.5 eV or less, more preferably 0.4 eV or less.

In the analysis range, the maximum value $E_{max}$ is preferably 41.92 eV or more, more preferably 42.00 eV or more, and preferably 42.20 eV or less, more preferably 42.12 eV or less. The minimum value $E_{min}$ is preferably 41.95 eV or less, more preferably 41.90 eV or less, and preferably 41.50 eV or more, more preferably 41.60 eV or more.

In the analysis range, the slope of a line obtained by plotting the bond energy difference $E_{Sn}-E_{In}$ on the ordinate and the distance d on the abscissa, and approximating the plot by a least square method is preferably 0.005 eV/nm or more, more preferably 0.010 eV/nm or more, further preferably 0.013 eV/nm or more, and preferably 0.025 eV/nm or less, more preferably 0.020 eV/nm or less.

The intercept of the line is preferably 41.50 eV or more, more preferably 41.65 eV or more, and preferably 42.00 eV or less, more preferably 41.85 eV or less.

In the transparent conductive film, the resistivity of the transparent electrode layer after heating at 140° C. for 30 minutes may be $3.2 \times 10^{-4}$ Ωcm or less.

The transparent electrode layer has been heretofore defined by evaluating the bond energy difference $E_{Sn}-E_{In}$ between the bond energy $E_{Sn}$ of tin $3d_{5/2}$ and the bond energy $E_{In}$ of indium $3d_{5/2}$. The transparent electrode layer can also be defined by evaluating the oxygen atom ratio in the transparent electrode layer instead of the bond energy difference $E_{Sn}-E_{In}$ as described below.

Specifically, in a transparent conductive film including a transparent film substrate and an amorphous transparent electrode layer on the transparent film substrate, the transparent electrode layer is formed of indium tin composite oxide, and has a tin oxide content of 3 to 12% by mass and a thickness of 15 to 30 nm, and the transparent electrode layer preferably satisfies the following requirements (3) and (4) in the following analysis range, with respect to the oxygen atom ratio determined by X-ray photoelectron spectroscopy measurement:

analysis range: a region which contains 40 atom % or more of indium and which does not include a region where a distance d from the surface of the transparent electrode layer in the thickness direction is from 0 to 3 nm;

(3) the minimum value $O_{min}$ of the oxygen atom ratio is present closer to the surface of the transparent electrode layer than the maximum value $O_{max}$ of the oxygen atom ratio; and (4) a difference $O_{max}-O_{min}$ between the maximum value $O_{max}$ and the minimum value $O_{min}$ is 1.8 at % or more.

It is considered that when the requirements (3) and (4), instead of the requirements (1) and (2), are satisfied, a transparent conductive film which is hardly crystallized in a room-temperature environment and is crystallized by short-time heating can be formed.

In the analysis range, the difference $O_{max}-O_{min}$ between the maximum value $O_{max}$ and the minimum value $O_{min}$ is preferably 1.8 at % or more, more preferably 2.2 at % or more, and preferably 4.0 at % or less, more preferably 3.7 at % or less.

In the analysis range, the maximum value $O_{max}$ is preferably 53.2 at % or more, more preferably 53.4 at % or more, and preferably 54.8 at % or less, more preferably 54.4 at % or less. The minimum value $O_{min}$ is preferably 51.9 at % or less, more preferably 51.7 at % or less, and preferably 49.8 at % or more, more preferably 50.0 at % or more.

In the analysis range, the slope of a line obtained by plotting the oxygen atom ratio on the ordinate and the distance d on the abscissa, and approximating the plot by a least square method is preferably 0.048 at %/nm or more, more preferably 0.090 at %/nm or more, further preferably 0.10 at %/nm or more, and preferably 0.20 at %/nm or less, more preferably 0.15 at %/nm or less, further preferably 0.13 at %/nm or less.

The intercept of the line is preferably 50.5 at % or more, more preferably 50.9 at % or more, and preferably 52.0 at % or less, more preferably 51.5 at % or less.

Various configurations can be employed for the transparent conductive film. For example, an inorganic insulating layer may be provided between the transparent film substrate and the transparent electrode layer for the purpose of improving adhesion between the substrate and the transparent electrode layer. Particularly, it is preferable to provide a SiOx (x=1.8 to 2.0) layer between the transparent film substrate and the transparent electrode layer for securing both high transparency and adhesion. Specific examples of the configuration of the transparent conductive film include a configuration in which a SiOx layer as an underlying layer, a $Nb_2O_5$ layer or $SiO_2$ layer as an optical adjustment layer, and an ITO layer as a transparent electrode layer are stacked in this order on a transparent film substrate; a configuration in which an organic-inorganic composite material layer as an easily adhesive layer, and an ITO layer as a transparent electrode layer are stacked in this order on a transparent film substrate; a configuration in which an organic material layer as a stress buffer layer, an inorganic optical adjustment layer, and an ITO layer as a transparent electrode layer are stacked in this order on a transparent film substrate; and a configuration in which an organic-inorganic composite material layer as a hard coat layer having an optical adjustment ability, and an ITO layer as a transparent electrode layer are stacked in this order. In addition to the above-mentioned examples, an optical adjustment layer, an antireflection layer, an antiglare layer, an easily adhesive layer, a stress buffer layer, a hard coat layer, an easily slipping layer, an antistatic layer, a crystallization accelerating layer, a durability improving layer, and/or other functional layer can be provided, for example, between the transparent electrode layer and the transparent film substrate, on the surface of the transparent electrode layer, or a surface of the transparent film substrate on a side opposite to the transparent electrode layer. These functional layers may each have single function, or a plurality of functions. Only one of these functional layers may be used, or two or more thereof may be stacked and used. These functional layers may be formed using, for example, a dry process such as sputtering or aerosol deposition, or a wet process in which inorganic particles are dispersed with an organic substance as a binder, or an inorganic film is formed by a sol-gel method. As raw materials of these functional layers, acryl-based organic substance, urethane-based organic substances, silicone-based compounds, silane compounds, imide compounds, elements such as magnesium, calcium, titanium, yttrium, zirconium, niobium, zinc, aluminum, indium, silicon, tin and carbon, compounds such as oxides, nitrides and fluorides including these elements, compounds obtained by combination thereof, and so on may be preferably used.

[Method for Producing Transparent Conductive Film]

The transparent conductive film can be produced by depositing an amorphous transparent electrode layer on a transparent film substrate. An inorganic insulating layer may be deposited between the transparent film substrate and the transparent electrode layer as necessary.

As a method for depositing a transparent electrode layer and an inorganic insulating layer, a sputtering method is desirable, because a film which has a low content of impurities and is homogeneous can be formed with high deposition rate and excellent productivity. In a sputtering method, deposition is performed while a carrier gas including an inert gas such as argon or nitrogen and an oxygen gas is introduced into a deposition chamber. The introduced gas is preferably a mixed gas of argon and oxygen.

In the present invention, a transparent electrode layer that satisfies specific requirements as described above (bond energy difference or oxygen atom ratio) can be formed by performing deposition under different deposition conditions in two or more stages. Hereinafter, an example of depositing a transparent electrode layer under deposition conditions in two stages will be described, where a transparent electrode layer (first electrode layer 22a) on the transparent film substrate side is referred to as a bottom ITO layer, and a transparent electrode layer (second electrode layer 22b) deposited on the top part thereof is referred to as a top ITO layer.

The amount of oxygen introduced during deposition of the bottom ITO layer is preferably larger than the amount of oxygen introduced during deposition of the top ITO layer that is subsequently deposited. First, the bottom ITO layer is deposited while a large amount of oxygen is introduced, so that an underlying layer with tin oxidized more strongly as compared to indium may be formed, and an effect as an underlying layer for accelerating crystal growth can be imparted to ITO in the vicinity of the substrate interface. Thereafter, the top ITO layer is deposited with the amount of oxygen being reduced, so that the bond state between tin and oxygen and the bond state between indium and oxygen may be changed in the thickness direction. As a result, a transparent electrode layer that satisfies the requirements (1) and (2) for the bond energy difference can be formed. When the amount of oxygen introduced during deposition is changed in the thickness direction as described above, a transparent electrode layer that satisfies the requirements (3) and (4) for the oxygen atom ratio can be formed. As explained above, a transparent conductive film which is hardly crystallized in a room-temperature environment and is crystallized by short-time heating can be obtained.

A method in which the oxygen partial pressure in deposition of a transparent electrode layer is reduced in a direction from the transparent film substrate side to the outermost surface of the transparent electrode layer has been known. In the conventional method, introduction of a large amount of oxygen during deposition of ITO promotes inactivation of carriers, and increases scattering of neutral impurities to increase resistance, so that functions as a transparent electrode are deteriorated. On the other hand, it is considered that in the present invention, introduction of a large amount of oxygen is limited to the vicinity of the substrate interface (thickness of 1 to 4 nm from the substrate surface), so that the functions of the transparent electrode are not deteriorated, and a region which serves to control crystal growth can be made to exist in the ITO film.

The oxygen partial pressure during deposition of the bottom ITO layer is preferably $1.5 \times 10^{-3}$ to $7 \times 10^{-3}$ Pa, more preferably $2 \times 10^{-3}$ to $5 \times 10^{-3}$ Pa.

For forming a transparent electrode layer that satisfies the above-mentioned requirements, the bottom ITO layer is preferably thinner than the top ITO layer, and specifically, the thickness of the bottom ITO layer is preferably 1 nm or more and 4 nm or less, more preferably 2 nm or more and 4 nm or less. The bottom ITO layer into which a large amount of oxygen is introduced hardly exhibits conductivity, and causes an increase in resistance, and therefore the thickness of the bottom ITO layer is preferably 50% or less, more preferably 20% or less of the total thickness.

The power in deposition of the bottom ITO layer is preferably higher than the power in deposition of the top ITO layer. The power during deposition of the bottom ITO layer is preferably 2 to 8 kW, more preferably 2 to 5 kW.

Particularly, by introducing a larger amount of oxygen and setting a lower deposition power in deposition of the bottom ITO layer than in deposition of the top ITO layer, the effect of introducing a large amount of oxygen can be enhanced.

The conditions for deposition of the top ITO layer are not particularly limited. The oxygen partial pressure during deposition of the top ITO layer is preferably $3 \times 10^{-4}$ to $10 \times 10^{-4}$ Pa, more preferably $6 \times 10^{-4}$ to $9 \times 10^{-4}$ Pa. The power during deposition of the top ITO layer is preferably 9 to 15 kW, more preferably 10 to 13 kW.

The thickness of the top ITO layer is preferably 14 nm or more and 29 nm or less, more preferably 15 nm or more and 20 nm or less. The total thickness of the bottom ITO layer and the top ITO layer is preferably 15 nm or more and 30 nm or less, more preferably 18 or more nm and 25 nm or less.

The bottom ITO layer and the top ITO layer may be continuously deposited with deposition conditions changed with time, or may be deposited several times with deposition conditions changed in the same deposition chamber, or may be deposited using a plurality of deposition chambers set to respective conditions.

Change of deposition conditions from those for the bottom ITO layer to those for the top ITO layer may be continuous, or discontinuous. Although the deposition is not limited to two-stage deposition in which the bottom ITO layer and the top ITO layer are deposited, the transparent electrode layer may be deposited under deposition conditions in two or more stages.

As a target to be used during deposition, for example, a metal, a metal oxide or a metal carbide can be used. The target for the transparent electrode is preferably a sintered body with tin oxide solid-dissolved in indium oxide.

It is preferable to deposit the transparent electrode layer using a target having the same tin oxide content even when deposition conditions are changed. The tin oxide content in the target is not particularly limited. When the tin oxide content is excessively low, the carrier density after crystallization decreases to increase resistance, and when the tin oxide content is excessively large, tin oxide scatters electrons to reduce the mobility, leading to an increase in resistance. Accordingly, particularly in deposition of the top ITO layer which is expected to exhibit high conductivity, the tin oxide content in the target is preferably 3% or more by mass and 12% or less by mass. The tin oxide content in the target to be used for deposition of the top ITO layer is preferably 6% or more by mass and 10% or less by mass for improving moisture and heat resistance after crystallization. Since the crystallization control function is important, the tin oxide content in the target to be used for deposition of the bottom ITO layer is not necessarily required to be set in the above-mentioned range in expectation of conductivity. A difference between the tin oxide content in the target to be used for deposition of the bottom ITO layer and the tin oxide content in the target to be used for deposition of the top ITO layer is preferably 10% by mass or less from the viewpoint of lattice matching.

It is known that water is adsorbed to a chamber opened to the air. Water penetrates into a film during formation of the transparent electrode layer, and acts as impurities. Accordingly, the back pressure (pressure in the chamber before introduction of a process gas) is preferably $10^{-3}$ Pa or less in formation of the transparent electrode layer. The pressure (total pressure) in the chamber after introduction of the process gas is preferably 0.1 Pa to 1.0 Pa, more preferably 0.2 Pa to 0.6 Pa.

The transparent electrode layer immediately after deposition contains an amorphous component, and may also contain a crystalline component. The content ratio of the crystalline component in the transparent electrode layer immediately after deposition is less than 50%. The content ratio of the crystalline component can be determined from the area ratio of crystal grains in the field of view based on a plane observation photograph of the transparent electrode layer in a scanning transmission electron microscope (STEM).

By heating (annealing) the thus-obtained transparent conductive film, the amorphous transparent electrode layer can be crystallized, so that the resistance of the transparent conductive film can be reduced. When a transparent electrode layer satisfying specific requirements is deposited by the above-mentioned method, both resistance stability in a room-temperature environment and low resistance can be achieved at the same time, such that resistance is not changed even when a transparent conductive film immediately after deposition is placed at 25° C. for 1 week, and the resistivity after a transparent conductive film immediately after deposition is heated at 140° C. for 30 minutes is $3.0 \times 10^{-4}$ Ωcm or less.

The heating temperature and heating time can be appropriately selected. The heating temperature is preferably 120 to 160° C., more preferably 130 to 150° C. The heating time is preferably 60 minutes or less, more preferably 45 minutes or less, further preferably 30 minutes or less. For crystallizing the transparent electrode layer, the heating time is preferably 5 minutes or more.

EXAMPLES

Hereinafter, the present invention will be described in detail by showing examples. The present invention is not limited to these examples.

[Measurement of Thickness]

The thickness of a transparent electrode layer was determined by observation of a cross-section with a transmission electron microscope (TEM). The total thickness of the transparent electrode layer was determined by TEM observation, and the thickness of each of a bottom ITO layer and a top ITO layer was calculated from the ratios of the deposition time and the deposition power.

[Measurement of Resistivity]

The resistivity was calculated from the value of a sheet resistance obtained by a four-probe method using Loresta GP manufactured by Mitsubishi Chemical Corporation, and the thickness determined by the TEM observation of the cross-section.

[Measurement of Crystallization Time]

Figure 2:
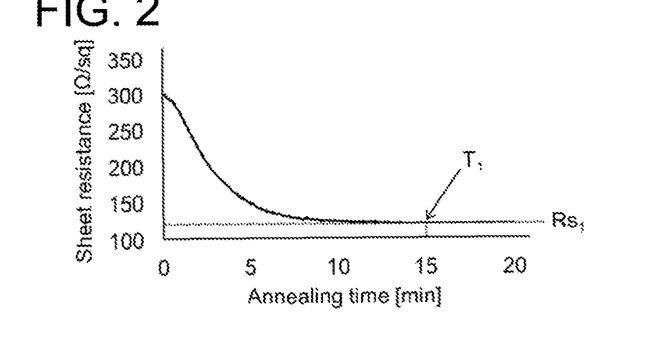
FIG. 2 is a graph showing a temporal change in resistance value of a transparent electrode layer during annealing.

The transparent electrode layer before heating (annealing) is mostly amorphous, and is converted to a low-resistance transparent electrode by changing from an amorphous state to a crystalline state. In other words, the amount of change in resistance reflects the amount of change from an amorphous state to a crystalline state. Accordingly, a temporal change of the crystallization process can be examined by examining a temporal change in resistance during annealing. Thus, the time required for crystallization was measured from a temporal change in resistance during annealing. When crystallization is completed, a temporal change in resistance is ended. It was determined that crystallization was completed at the time when a difference with respect to the resistance value when a temporal change in resistance ended was 1 Ω/sq or less. FIG. 2 is a graph showing one example of a result of measuring a temporal change in resistance during annealing. It can be read from FIG. 2 that the resistance value $R_{S1}$ is 120 Ω/sq when a temporal change in resistance ends, and the crystallization completion time $T_1$ is 15 minutes.

Figure 3:
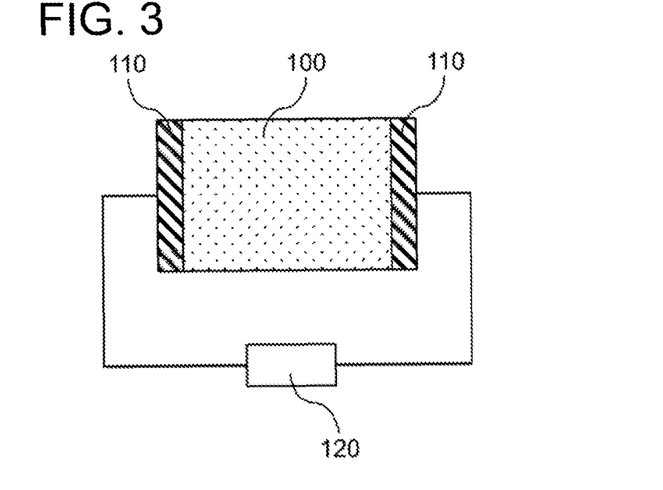
FIG. 3 is a schematic view of a transparent conductive film to which parallel electrodes are attached.

FIG. 3 is a schematic view of a transparent conductive film with parallel electrodes attached thereto. Measurement of the resistance in annealing was performed in the following manner: parallel electrodes 110 were attached to two opposite sides of a transparent conductive film 100 before annealing, the transparent conductive film was put in a hot air circulation oven, and a temporal change in resistance was measured using a resistance measuring apparatus 120. The parallel electrodes were attached and experiments were conducted. The distance between the electrodes were made equal to the length of each of the sides to which the electrodes were attached, so that the sheet resistance can be calculated from the resistance value.

Measurement of the resistance after completion of crystallization was performed by a four-probe method using Loresta GP manufactured by Mitsubishi Chemical Corporation after the transparent conductive film, for which a change in resistance was ended, was taken out from the oven, and the parallel electrodes were removed from the film.

[Evaluation of Resistance Stability]

The sheet resistance of the transparent conductive film immediately after deposition was measured, the transparent conductive film was then stored in an environment at 25° C. for 1 week, and a change in resistance was measured to evaluate resistance stability in a room-temperature environment. Measurement of the sheet resistance was performed by a four-probe method using Loresta GP manufactured by Mitsubishi Chemical Corporation. The resistance change ratio expressed as $R_1/R_0$ was evaluated, where $R_0$ is a resistance immediately after deposition, and $R_1$ is a resistance after elapse of 1 week at 25° C.

[Evaluation of Crystallization]

The crystallinity of the transparent electrode layer immediately after deposition was evaluated by immersing the transparent electrode layer in 5% hydrochloric acid in a room-temperature environment for 10 minutes. When the sheet resistance increased by a factor of 100 or more after the immersion, the transparent electrode layer was determined to be amorphous. In all of the following Examples and Comparative Examples, the transparent electrode layer immediately after deposition was confirmed to be amorphous.

[Measurement of XPS]

XPS measurement and analysis were performed using Quantum 2000 manufactured by ULVAC-PHI, INCORPORATED and Multipak program equipped therewith, respectively. The measurement was performed in units of 0.25 eV for each of a signal originating from an indium $3d_{5/2}$ orbit (In$3d_{5/2}$) observed near 444 eV, a signal originating from a tin $3d_{5/2}$ orbit (Sn$3d_{5/2}$) observed near 486 eV, a signal originating from an oxygen 1s orbit (O1s) observed near 529 eV, a signal originating from a carbon 1s orbit (C1s), a signal originating from a nitrogen 1s orbit (N1s), and a signal originating from a silicon 2p orbit (Si2p), so that a peak-shaped spectrum was obtained. The measurement was repeatedly performed from the outermost surface of the transparent electrode layer in alternation with argon etching until indium was no longer observed. Argon etching was performed for 1 minute per one time, and the etching was performed to 1.3 nm per one time. For each peak that was obtained in this way, fitting was performed by a Gaussian function to calculate the bond energy as the center of the peak, and the maximum value of the peak. Fitting was performed using a single Gaussian function with a constant set as a background as shown in the following Formula 1 for reflecting the asymmetry of the peak in the peak position. In the Formula 1, y is a peak intensity, x is an energy value, e is a Napier's constant showing the base of natural logarithm, and π is the circular constant. Fitting was performed while the four constants a, b, c and d in the formula 1 were changed to minimize a difference with respect to the measured value.

$$y = \frac{a}{\sqrt{2\pi} \, b} e^{-\left(\frac{(x-c)^2}{2b^2}\right)} + d \qquad \text{[Formula 1]}$$

[Calculation of Bond Energy Difference]

Figure 4:
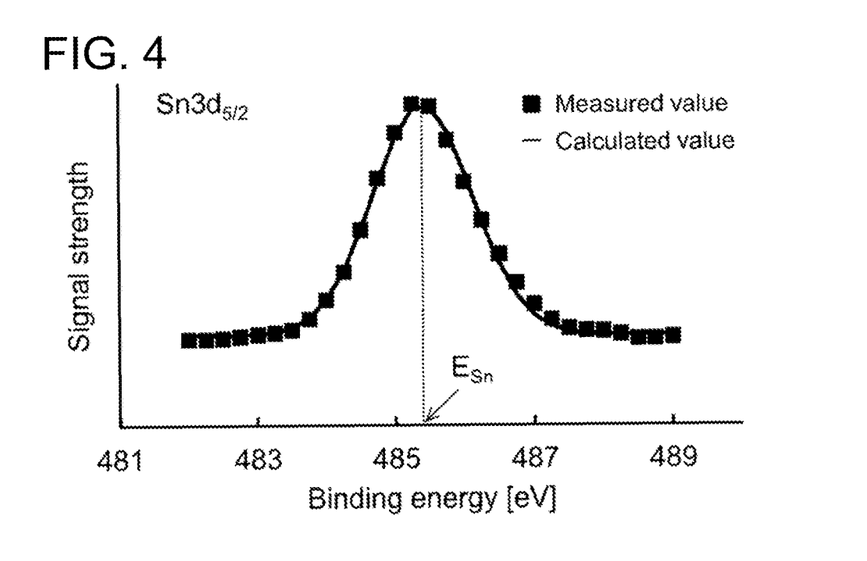
FIG. 4 is a view showing a $Sn3d_{5/2}$ peak position obtained by XPS measurement.
Figure 5:
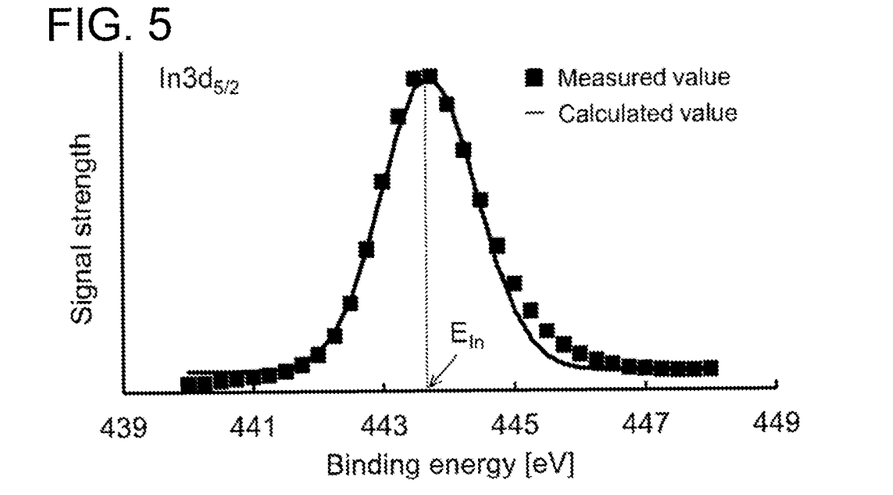
FIG. 5 is a view showing an $In3d_{5/2}$ peak position obtained by XPS measurement.

FIG. 4 shows one example of a peak of Sn$3d_{5/2}$ for which the bond energy is calculated by fitting using a Gaussian function. FIG. 5 shows one example of a peak of In$3d_{5/2}$ for which the bond energy is calculated by fitting using a Gaussian function. FIG. 4 indicates that that the bond energy $E_{Sn}$ of Sn$3d_{5/2}$ is 485.40 eV, and FIG. 5 indicates that the bond energy $E_{In}$ of In$3d_{5/2}$ is 443.72 eV. A bond energy difference $E_{Sn}-E_{In}$ between tin and indium was evaluated by subtracting the bond energy $E_{In}$ of In$3d_{5/2}$ from the bond energy $E_{Sn}$ of Sn$3d_{5/2}$ for eliminating an influence of charging from the measurement result.

[Calculation of Oxygen Atom Ratio]

The ratios of elements (ratios of atoms) contained in the sample were determined by comparing the peak maximum values of the elements in an object to be measured in XPS measurement as described above. In Examples and Comparative Examples, the composition element ratio was calculated using the integrated intensity and sensitive coefficient of each peak subjected to smoothing, and then background cut-off. A series of analysis was performed using Multipak equipped in a measuring apparatus. 3 points from Savitzky-Golay was used for smoothing, and Shirley was used for background cut-off. Since the sensitivity coefficient varies depending on the measuring apparatus, values included in Multipak attached to the measuring apparatus were used. The physical meaning of the sensitive coefficient is described in detail in, for example, "Handbook of X-ray Photoelectron Spectroscopy" from Physical Electronics Company. The total content of In, Sn, O, C, N and Si, elements expected to be contained, was set to 100%, and the ratios of the elements included therein were calculated.

Figure 6:
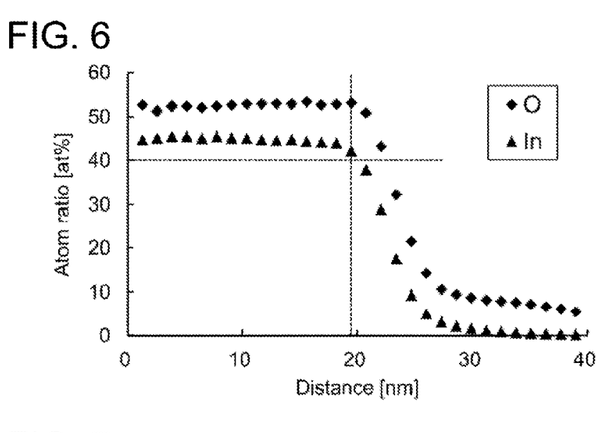
FIG. 6 shows an element profile obtained by XPS depth profile measurement.

FIG. 6 shows one example of an element profile obtained from XPS depth profile measurement. It is considered that a region from 0 to 1 nm from the surface of the transparent electrode layer may include contaminants from the air. It is also considered that in region from 0 to 3 nm from the surface, the process of crystallization of the transparent electrode layer is different from that inside the layer. Therefore, these regions were excluded from data to be used for analysis. The interface between the transparent electrode layer and the substrate is difficult to clearly define due to influences of diffusion of atoms, etc. Accordingly, in Examples and Comparative Examples, a region having an In concentration of 40 atom % or more was defined as an analysis range, and in the analysis range, the bond energy difference and the oxygen atom ratio were evaluated.

Example 1

As a transparent film substrate, a PET film (glass transition temperature: 80° C.) provided with a hard coat layer having a function of refractive index matching on both sides was used. The transparent film substrate was heated in vacuum to be degassed before deposition of a transparent electrode layer thereon. Thereafter, an ITO was deposited on the hard coat layer of the transparent film substrate by a roll-to-roll method using a sputtering method.

The deposition of ITO was performed in two stages in the following manner: a bottom ITO layer was deposited on the substrate under the condition of a large oxygen introduction amount, and a top ITO layer was deposited on the bottom ITO layer under the condition of a smaller oxygen introduction amount and a larger discharge power as compared to the bottom ITO layer.

In the deposition of ITO, targets of indium tin composite oxide (tin oxide content: 7.0% by mass) were arranged side by side to make them into a dual cathode, and sputtering was performed with a MF power source. First, the bottom ITO layer was deposited to have a thickness of 3 nm with a power of 3 kW and an oxygen partial pressure of $2.0 \times 10^{-3}$ Pa. Next, the top ITO layer was deposited to have a thickness of 17 nm on the bottom ITO layer with a power of 12 kW and an oxygen partial pressure of $8.0 \times 10^{-4}$ Pa. The pressure in the chamber was set to 0.2 Pa in deposition of each of the layers.

The resistivity before annealing (immediately after deposition) was $7.2 \times 10^{-4}$ Ωcm, the time required for crystallization in annealing at 140° C. was 20 minutes, and the resistivity after completion of crystallization was $2.8 \times 10^{-4}$ Ωcm. The resistance change ratio after elapse of 1 week at 25° C. was 1.0, and thus there was no change in resistance.

The maximum value $E_{max}$ of a bond energy difference $E_{Sn}$-$E_{In}$ between the bond energy $E_{Sn}$ and the bond energy $E_{In}$ was 42.09 eV, the minimum value $E_{min}$ of the bond energy difference $E_{Sn}$-$E_{In}$ was 41.85 eV, and a difference $E_{max}$-$E_{min}$ between the maximum value $E_{max}$ and the minimum value $E_{min}$ was 0.24 eV. The maximum value $O_{max}$ of the oxygen atom ratio was 53.6 at %, the minimum value $O_{min}$ of the oxygen atom ratio was 50.1 at %, and a difference $O_{max}$-$O_{min}$ between the maximum value $O_{max}$ and the minimum value $O_{min}$ was 3.5 at %.

Example 2

The same procedure as in Example 1 was carried out to deposit ITO, except that before deposition of ITO, a $SiO_2$ layer was deposited in a thickness of 3 nm on a hard coat layer, and a bottom ITO layer was deposited on the $SiO_2$ layer.

In the deposition of the $SiO_2$ layer, Si was used as a target, oxygen and argon were supplied at flow rates of 200 sccm and 1000 sccm, respectively, the pressure in the chamber was set to 0.2 Pa, and sputtering was performed at a power of 10 kW using a MF power source. The thickness of the obtained $SiO_2$ layer was 3 nm.

The resistivity before annealing was $4.8 \times 10^{-4}$ Ωcm, the time required for crystallization in annealing at 140° C. was 10 minutes, and the resistivity after completion of crystallization was $2.8 \times 10^{-4}$ Ωcm. The resistance change ratio after elapse of 1 week at 25° C. was 1.0, and thus there was no change in resistance.

The maximum value $E_{max}$ of a bond energy difference $E_{Sn}$-$E_{In}$ between the bond energy $E_{Sn}$ and the bond energy $E_{In}$ was 42.01 eV, the minimum value $E_{min}$ of the bond energy difference $E_{Sn}$-$E_{In}$ was 41.67 eV, and a difference $E_{max}$-$E_{min}$ between the maximum value $E_{max}$ and the minimum value $E_{min}$ was 0.34 eV. The maximum value $O_{max}$ of the oxygen atom ratio was 54.1 at %, the minimum value $O_{min}$ of the oxygen atom ratio was 51.5 at %, and a difference $O_{max}$-$O_{min}$ between the maximum value $O_{max}$ and the minimum value $O_{min}$ was 2.6 at %.

Comparative Example 1

The same procedure as in Example 1 was carried out to deposit ITO, except that the bottom ITO layer was not deposited, and an ITO layer was deposited in a thickness of 23 nm under the deposition conditions for the top ITO layer, i.e., a power of 12 kW and an oxygen partial pressure of $8.0 \times 10^{-4}$ Pa.

The resistivity before annealing was $7.8 \times 10^{-4}$ Ωcm, the time required for crystallization in annealing at 140° C. was 120 minutes, the resistivity after annealing at 140 for 30 minutes was $6.9 \times 10^{-4}$ Ωcm, and the resistivity after completion of crystallization was $2.8 \times 10^{-4}$ Ωcm. The resistance change ratio after elapse of 1 week at 25° C. was 1.0, and thus there was no change in resistance.

The maximum value $E_{max}$ of a bond energy difference $E_{Sn}$-$E_{In}$ between the bond energy $E_{Sn}$ and the bond energy $E_{In}$ was 41.86 eV, the minimum value $E_{min}$ of the bond energy difference $E_{Sn}$-$E_{In}$ was 41.56 eV, and a difference $E_{max}$-$E_{min}$ between the maximum value $E_{max}$ and the minimum value $E_{min}$ was 0.30 eV. The maximum value $O_{max}$ of the oxygen atom ratio was 52.8 at %, the minimum value $O_{min}$ of the oxygen atom ratio was 51.6 at %, and a difference $O_{max}$-$O_{min}$ between the maximum value $O_{max}$ and the minimum value $O_{min}$ was 1.2 at %.

Comparative Example 2

The same procedure as in Example 1 was carried out to deposit ITO, except the followings; instead of depositing the bottom ITO layer, a $SiO_2$ layer was deposited in a thickness of 3 nm on a hard coat layer under the same conditions as in Example 2; and an ITO layer was then deposited in a thickness of 20 nm under the deposition conditions for the top ITO layer in Example 1, i.e., a power of 12 kW and an oxygen partial pressure of $8.0 \times 10^{-4}$ Pa.

The resistivity before annealing was $4.8 \times 10^{-4}$ Ωcm, the time required for crystallization in annealing at 140° C. was 5 minutes, and the resistivity after completion of crystallization was $2.8 \times 10^{-4}$ Ωcm. The resistance change ratio after elapse of 1 week at 25° C. was 0.7, and thus reduction of resistance was confirmed.

The maximum value $E_{max}$ of a bond energy difference $E_{Sn}$-$E_{In}$ between the bond energy $E_{Sn}$ and the bond energy $E_{In}$ was 42.17 eV, the minimum value $E_{min}$ of the bond energy difference $E_{Sn}$-$E_{In}$ was 42.08 eV, and a difference $E_{max}$-$E_{min}$ between the maximum value $E_{max}$ and the minimum value $E_{min}$ was 0.09 eV. The maximum value $O_{max}$ of the oxygen atom ratio was 53.9 at %, the minimum value $O_{min}$ of the oxygen atom ratio was 52.6 at %, and a difference $O_{max}$-$O_{min}$ between the maximum value $O_{max}$ and the minimum value $O_{min}$ was 1.4 at %.

Comparative Example 3

The same procedure as in Example 1 was carried out to deposit ITO, except the followings: a bottom ITO layer was deposited in a thickness of 5 nm with a power of 1 kW and an oxygen partial pressure of $2.0 \times 10^{-3}$ Pa; and a top ITO layer was then deposited in a thickness of 15 nm with a power of 12 kW and an oxygen partial pressure of $8.0 \times 10^{-4}$ Pa.

The resistivity before annealing was $5.6 \times 10^{-4}$ Ωcm, the time required for crystallization in annealing at 140° C. was 300 minutes, the resistivity after annealing at 140 for 30 minutes was $4.8 \times 10^{-4}$ Ωcm, and the resistivity after completion of crystallization was $4.0 \times 10^{-4}$ Ωcm. The resistance change ratio after elapse of 1 week at 25° C. was 1.0, and thus there was no change in resistance.

The maximum value $E_{max}$ of a bond energy difference $E_{Sn}$-$E_{In}$ between the bond energy $E_{Sn}$ and the bond energy $E_{In}$ was 42.15 eV, the minimum value $E_{min}$ of the bond energy difference $E_{Sn}$-$E_{In}$ was 42.08 eV, and a difference $E_{max}$-$E_{min}$ between the maximum value $E_{max}$ and the minimum value $E_{min}$ was 0.07 eV. The maximum value $O_{max}$ of the oxygen atom ratio was 54.4 at %, the minimum value $O_{min}$ of the oxygen atom ratio was 53.0 at %, and a difference $O_{max}$-$O_{min}$ between the maximum value $O_{max}$ and the minimum value $O_{min}$ was 1.5 at %.

Figure 7:
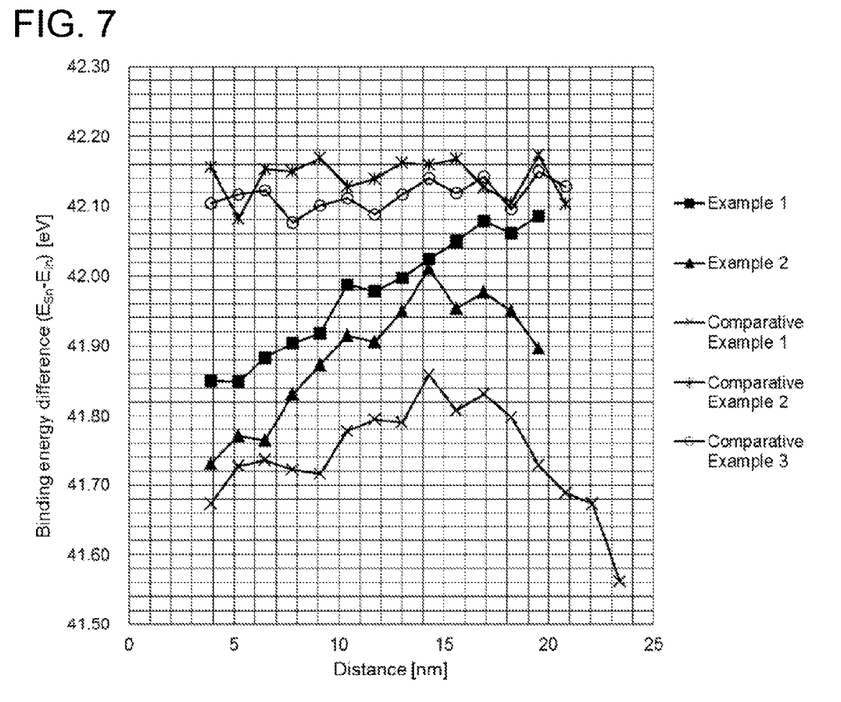
FIG. 7 is a graph showing a relationship between a bond energy difference $E_{Sn}-E_{In}$ and a distance from the surface of a transparent electrode layer.
Figure 8:
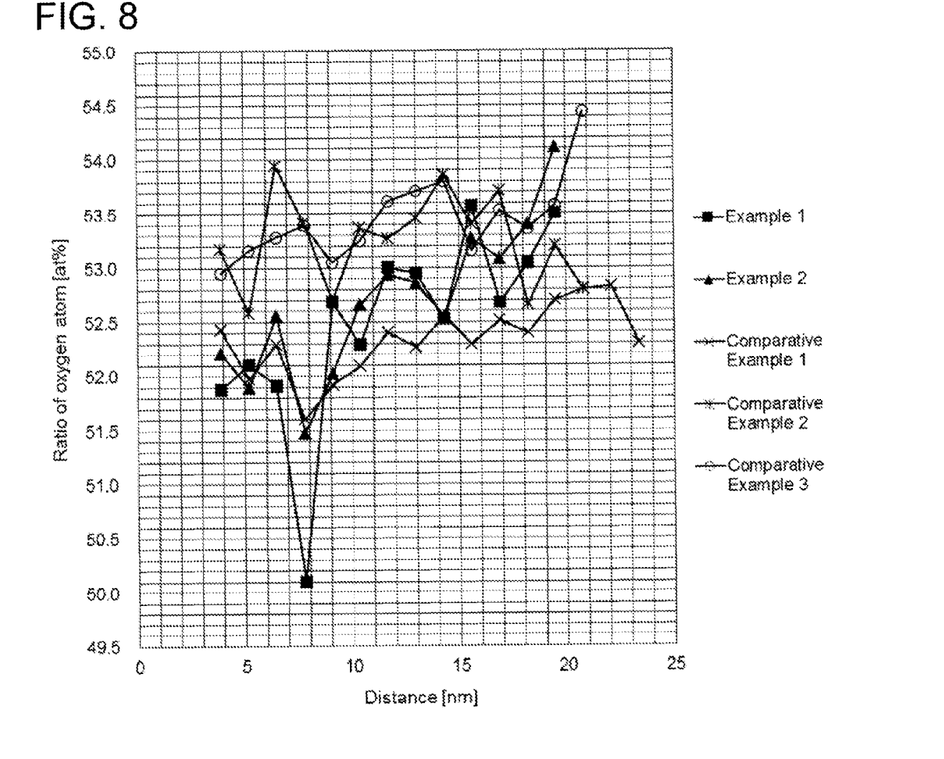
FIG. 8 is a graph showing a relationship between an oxygen atom ratio and a distance from the surface of a transparent electrode layer.

For Examples and Comparative Examples, a graph in which the bond energy difference $E_{Sn}$-$E_{In}$ is plotted on the ordinate, and the distance from the surface of the transparent electrode layer is plotted on the abscissa is shown in FIG. 7, and a graph in which the oxygen atom ratio is plotted on the ordinate, and the distance from the surface of the transparent electrode layer is plotted on the abscissa is shown in FIG. 8. Further, the results of Examples and Comparative Examples are summarized in Table 1.

mum value $E_{min}$ is 0.1 eV or more. As shown in FIG. 8 and Table 1, Examples 1 and 2 also satisfy the requirement that the minimum value $O_{min}$ of the oxygen atom ratio is present closer to the surface of the transparent electrode layer than the maximum value $O_{max}$ of the oxygen atom ratio, and the difference $O_{max}$-$O_{min}$ between the maximum value $O_{max}$ and the minimum value $O_{min}$ is 1.8 at % or more. It has been confirmed that by satisfying these requirements, a transparent conductive film which is hardly crystallized in a room-temperature environment and is crystallized by short-time heating can be formed.

It can be understood that in Examples 1 and 2, a transparent electrode layer that satisfies the above-mentioned requirements can be formed by increasing the oxygen introduction amount in the initial stage of deposition. It can also be understood that a transparent electrode layer that satisfies the above-mentioned requirement may not be formed as in Comparative Example 3, depending on a thickness or a deposition power, even when the oxygen partial pressure during deposition of the bottom ITO layer is high.

In Comparative Example 1, the difference $E_{max}$-$E_{min}$ between the maximum value $E_{max}$ and the minimum value $E_{min}$ is 0.1 eV or more, but the minimum value $E_{min}$ is not present closer to the surface of the transparent electrode layer than the maximum value $E_{max}$. As a result, the time required for crystallization is as long as 120 minutes. This

TABLE 1

| | | | Example 1 | Example 2 | Comparative Example 1 | Comparative Example 2 | Comparative Example 3 |
|---|---|---|---|---|---|---|---|
| Deposition conditions | Thickness | SiO₂ layer (nm) | — | 3 | — | 3 | — |
| | | Bottom ITO layer (nm) | 3 | 3 | — | — | 5 |
| | | Top ITO layer (nm) | 17 | 17 | 23 | 20 | 15 |
| | | Total of ITO layers (nm) | 20 | 20 | 23 | 20 | 20 |
| | Oxygen partial pressure | Bottom ITO layer ($\times 10^{-3}$ Pa) | 2.0 | 2.0 | — | — | 2.0 |
| | | Top ITO layer ($\times 10^{-4}$ Pa) | 8.0 | 8.0 | 8.0 | 8.0 | 8.0 |
| | Power | Bottom ITO layer (kW) | 3 | 3 | — | — | 1 |
| | | Top ITO layer (kW) | 12 | 12 | 12 | 12 | 12 |
| Measurement of resistance | Resistivity immediately after deposition ($\times 10^{-4}$ Ωcm) | | 7.2 | 4.8 | 7.8 | 4.8 | 5.6 |
| | Resistivity after annealing at 140° C. for 30 minutes ($\times 10^{-4}$ Ωcm) | | 2.8 | 2.8 | 6.9 | 2.8 | 4.8 |
| | Resistivity immediately after completion of crystallization ($\times 10^{-4}$ Ωcm) | | 2.8 | 2.8 | 2.8 | 2.8 | 4.0 |
| | Resistance change ratio after elapse of 1 week at 25° C. (times) | | 1.0 | 1.0 | 1.0 | 0.7 | 1.0 |
| | Crystallization time at 140° C. (minutes) | | 20 | 10 | 120 | 5 | 300 |
| XPS measurement | Bond energy difference $E_{Sn}$ − $E_{In}$ | Maximum value $E_{max}$(eV) | 42.09 | 42.01 | 41.86 | 42.17 | 42.15 |
| | | Maximum value $E_{min}$(eV) | 41.85 | 41.67 | 41.56 | 42.08 | 42.08 |
| | | $E_{max}$ − $E_{min}$(eV) | 0.24 | 0.34 | 0.30 | 0.09 | 0.07 |
| | | Slope of primary line (eV/nm) | 0.017 | 0.014 | −0.0021 | −0.00027 | 0.0018 |
| | | Intercept of primary line (eV) | 41.78 | 41.72 | 41.77 | 42.14 | 42.09 |
| | | Average value (eV) | 41.97 | 41.89 | 41.74 | 42.14 | 42.12 |
| | Oxygen Atom ratio | Maximum value $O_{max}$ (at %) | 53.6 | 54.1 | 52.8 | 53.9 | 54.4 |
| | | Minimum value $O_{max}$ (at %) | 50.1 | 51.5 | 51.6 | 52.6 | 53.0 |
| | | $O_{max}$ − $O_{min}$ (at %) | 3.5 | 2.6 | 1.2 | 1.4 | 1.5 |
| | | Slope of primary line (at %/nm) | 0.12 | 0.12 | 0.034 | −0.004 | 0.047 |
| | | Intercept of primary line (at %) | 51.1 | 51.3 | 51.9 | 53.3 | 52.9 |
| | | Average value (at %) | 52.5 | 52.7 | 52.3 | 53.3 | 53.4 |

Table 1 exhibits that in Examples 1 and 2, the resistance is not changed in even after elapse of 1 week at 25° C., and the time required for crystallization at 140° C. is 30 minutes or less.

As shown in FIG. 7 and Table 1, Examples 1 and 2 satisfy the requirement that the minimum value $E_{min}$ of the bond energy difference $E_{Sn}$-$E_{In}$ is present closer to the surface of the transparent electrode layer than the maximum value $E_{max}$ of the bond energy difference $E_{Sn}$-$E_{In}$, and the difference $E_{max}$-$E_{min}$ between the maximum value $E_{max}$ and the miniresult shows that crystal nuclei for crystallization by heating may hard to be formed when the bond energy difference $E_{Sn}$-$E_{In}$ is small on the transparent film substrate side.

In Comparative Example 2 and Comparative Example 3 where the difference $E_{max}$-$E_{min}$ between the maximum value $E_{max}$ and the minimum value $E_{min}$ is less than 0.1 eV, the crystallization rate is so high that crystallization occurs in a room-temperature environment (Comparative Example 2), or conversely the crystallization rate is excessively low (Comparative Example 3).

When the difference $E_{max}-E_{min}$ between the maximum value $E_{max}$ and the minimum value $E_{min}$ is less than 0.1 eV, it indicates that the amount of change in bond energy difference $E_{Sn}-E_{In}$ in the thickness direction of the transparent electrode layer is small. This suggests that the transparent electrode layer is formed while the bond state between tin and oxygen and the bond state between indium and oxygen are almost unchanged in the thickness direction. Accordingly, it is considered that in Comparative Example 2 where an underlying layer such as $SiO_2$ for accelerating crystallization is formed, the crystallization rate of the transparent electrode layer is so high that crystallization occurs in a room-temperature environment. It is considered that in Comparative Example 3 where an underlying layer which does not serve to accelerate crystallization, such as the bottom ITO layer, is formed, it takes a long time to crystallize the transparent electrode layer.

From the results above, it has become apparent that by forming a transparent electrode layer that satisfies specific requirements, a transparent conductive film which is hardly crystallized in a room-temperature environment and is crystallized by short-time heating can be provided.

DESCRIPTION OF REFERENCE CHARACTERS 11 transparent film substrate
22 transparent electrode layer
22a first electrode layer
22b second electrode layer
100 transparent conductive film

The invention claimed is:

1. A transparent conductive film comprising: a transparent film substrate; and a transparent electrode layer on the transparent film substrate, wherein
the transparent electrode layer is formed of amorphous indium tin composite oxide, and has a tin oxide content of 3 to 12% by mass and a thickness of 15 to 30 nm,
a bond energy $E_{Sn}$ of tin $3d_{5/2}$ and a bond energy $E_{In}$ of indium $3d_{5/2}$ as determined by X-ray photoelectron spectroscopy measurement satisfy the following requirements in an analysis range of the transparent electrode layer:
a minimum point of a bond energy difference $E_{Sn}-E_{In}$ between the bond energy $E_{Sn}$ and the bond energy $E_{In}$ is present closer to a surface of the transparent electrode layer than a maximum point of the bond energy difference $E_{Sn}-E_{In}$; and
a difference $E_{max}-E_{min}$ between the maximum value $E_{max}$ and the minimum value $E_{min}$ of the bond energy difference $E_{Sn}-E_{In}$ is 0.1 eV or more,
where the analysis range is a region which contains 40 atom % or more of indium and which does not include a region where a distance d from the surface of the transparent electrode layer in a thickness direction is from 0 to 3 nm.

2. The transparent conductive film according to claim 1, wherein
in the analysis range, a slope of a line obtained by plotting the bond energy difference $E_{Sn}-E_{In}$ on the ordinate and the distance d on the abscissa, and approximating the plot by a least square method is 0.005 eV/nm or more.

3. The transparent conductive film according to claim 1, wherein
in the analysis range, the maximum value $E_{max}$ of the bond energy difference $E_{Sn}-E_{In}$ is 41.92 eV or more.

4. The transparent conductive film according to claim 1, wherein
in the analysis range, the minimum value $E_{min}$ of the bond energy difference $E_{Sn}-E_{In}$ is 41.95 eV or less.

5. The transparent conductive film according to claim 1, wherein
a resistivity of the transparent electrode layer after heating at 140° C. for 30 minutes is $3.2 \times 10^{-4}$ Ωcm or less.

6. A method for producing a transparent conductive film comprising a transparent film substrate and a transparent electrode layer on the transparent film substrate, the transparent electrode layer being formed of amorphous indium tin composite oxide and having a tin oxide content of 3 to 12% by mass and a thickness of 15 to 30 nm,
the method including depositing the transparent electrode layer on the transparent film substrate,
the deposition is carried out under deposition conditions in two or more stages including: a first condition for depositing a first electrode layer having a thickness of 1 to 4 nm on a transparent film substrate; and a second condition for depositing a second electrode layer on the first electrode layer, and
thereby a bond energy, $E_{Sn}$ of tin $3d_{5/2}$ and a bond energy $E_{In}$ of indium $3d_{5/2}$ as determined by X-ray photoelectron spectroscopy measurement satisfy the following requirements in an analysis range of the thus deposited transparent electrode layer:
a minimum point of a bond energy difference $E_{Sn}-E_{In}$ between the bond energy $E_{Sn}$ and the bond energy $E_{In}$ is present closer to a surface of the transparent electrode layer than a maximum point of the bond energy difference $E_{Sn}-E_{In}$; and a difference $E_{max}-E_{min}$ between the maximum value $E_{max}$ and the minimum value $E_{min}$ of the bond energy difference $E_{Sn}-E_{In}$ is 0.1 eV or more,
where the analysis range is a region which contains 40 atom % or more of indium and which does not include a region where a distance d from the surface of the transparent electrode layer in a thickness direction is from 0 to 3 nm.

7. The method for producing a transparent conductive film according to claim 6, wherein an oxygen partial pressure in deposition of the first electrode layer is higher than an oxygen partial pressure in deposition of the second electrode layer.

8. The method for producing a transparent conductive film according to claim 6, wherein a power in deposition of the first electrode layer is smaller than a power in deposition of the second electrode layer.

9. The method for producing a transparent conductive film according to claim 6, wherein a tin oxide content in a target that is used in deposition of the first electrode layer is equal to a tin oxide content in a target that is used in deposition of the second electrode layer.

* * * * *